United States Patent
Wang

(10) Patent No.: US 11,322,529 B2
(45) Date of Patent: May 3, 2022

(54) DISPLAY PANEL, ELECTRONIC DEVICE, AND METHOD OF OPERATING SAME

(71) Applicant: WUHAN CHINA STAR OPTOELECTRONICS SEMICONDUCTOR DISPLAY TECHNOLOGY CO., LTD., Wuhan (CN)

(72) Inventor: Hai Wang, Wuhan (CN)

(*) Notice: Subject to any disclaimer, the term of this patent is extended or adjusted under 35 U.S.C. 154(b) by 241 days.

(21) Appl. No.: 16/622,949

(22) PCT Filed: Oct. 25, 2019

(86) PCT No.: PCT/CN2019/113299
§ 371 (c)(1),
(2) Date: Dec. 16, 2019

(87) PCT Pub. No.: WO2021/046982
PCT Pub. Date: Mar. 18, 2021

(65) Prior Publication Data
US 2021/0335865 A1    Oct. 28, 2021

(30) Foreign Application Priority Data
Sep. 10, 2019 (CN) .......................... 201910851210.4

(51) Int. Cl.
*H01L 27/146* (2006.01)
*G06F 3/01* (2006.01)
(Continued)

(52) U.S. Cl.
CPC ...... *H01L 27/14603* (2013.01); *G06F 1/1686* (2013.01); *G06F 3/013* (2013.01); *H01L 27/14612* (2013.01); *H01L 31/125* (2013.01)

(58) Field of Classification Search
CPC ......... H01L 27/14603; H01L 27/14612; H01L 31/125; G06F 3/013
See application file for complete search history.

(56) References Cited

U.S. PATENT DOCUMENTS

2014/0313308 A1* 10/2014 Wang ..................... A61B 3/113
                                                              348/78
2016/0079317 A1*  3/2016 Jeon ..................... H01L 27/3262
                                                              315/115
(Continued)

FOREIGN PATENT DOCUMENTS

CN    104575395 A    4/2015
CN    108174086 A    6/2018
(Continued)

*Primary Examiner* — Thanh Luu
(74) *Attorney, Agent, or Firm* — JMB Davis Ben-David

(57) ABSTRACT

The present invention relates to a display panel, an electronic device, and an operation method of the electronic device. The display panel is divided into a display region and a plurality of image capturing regions. Each of the image capturing regions includes: a camera module; a pixel module disposed on the camera module; and the pixel module includes a plurality of sub-pixel units, each of the sub-pixel units spaced apart on the camera module. By adding a plurality of cameras hidden under the display panel, the invention can not only improve accuracy of eye-tracking technology, but also prevent the problem of reduced appearance aesthetics caused by the plurality of cameras.

9 Claims, 5 Drawing Sheets

(51) Int. Cl.
    *H01L 31/12*    (2006.01)
    *G06F 1/16*     (2006.01)

(56) References Cited

U.S. PATENT DOCUMENTS

2016/0307509 A1    10/2016    Nie
2020/0104563 A1*    4/2020    Ryu ........................ G06F 3/042

FOREIGN PATENT DOCUMENTS

| CN | 109166902 A | 1/2019 |
| CN | 209056269 U | 7/2019 |
| KR | 20130140397 A | 12/2013 |

* cited by examiner

DISPLAY PANEL, ELECTRONIC DEVICE, AND METHOD OF OPERATING SAME

CROSS-REFERENCE TO RELATED APPLICATIONS

This is the U.S. National Stage of International Patent Application No. PCT/CN2019/113299 filed Oct. 25, 2019, which in turn claims the benefit of Chinese Patent Application No. 201910851210.4 filed Sep. 10, 2019.

FIELD OF INVENTION

The present invention relates to the field of display technology, and in particular, to a display panel, an electronic device, and a method of operating the electronic device.

BACKGROUND OF INVENTION

With vigorous development of mobile games, virtual reality, and augmented reality, people are no longer satisfied with the slower speed of the finger to control the screen and the movement of the model.

Technical Problem

For example, in multiplayer online battle arena (MOBA), a player not only has to control the characters in his current field of view but also needs to pay attention to the movements of other players on the small map. Wrong finger operation could be triggered before or after switching cameras. If eye-tracking technology can be added, the player merely needs to move the field of view to the area he wants to observe and stay for a certain period of time, which reduces the complexity of finger operation and allows more people to have fun in collective games. However, most electronic devices such as mobile phones, tablets, and laptops in the market have only one camera, and eye-tracking technology is limited in large-screen applications. Therefore, a solution to solve the limitations of eye-tracking technology is needed.

SUMMARY OF INVENTION

In view of the above drawbacks existing in the prior art, an object of the present invention is to provide a display panel and an electronic device. By adding a plurality of cameras hidden under the display panel, not only the accuracy of the eye-tracking technology can be improved, but also the problem of the appearance aesthetic deterioration caused by the plurality of cameras can be avoided.

The object of the present invention and solving the technical problems are achieved by the following technical solutions.

A display panel according to the present invention is divided into a display region and a plurality of image capturing regions, each of the image capturing regions including a camera module; and a pixel module disposed on the camera module and including a plurality of sub-pixel units, each of the sub-pixel units spaced apart on the camera module; wherein the image capturing regions are at least two and are disposed at upper right, lower right, middle of left, or middle of right of the display region.

An object of the present invention and the technical problems solved thereby can be further achieved by the following technical measures.

In an embodiment of the present invention, each of the sub-pixel units includes: a first substrate disposed on the camera module; an active switch disposed on the first substrate and including a thin film transistor disposed on the first substrate; a gate insulating layer disposed between the first substrate and a gate of the thin film transistor; an interlayer dielectric layer disposed on the gate insulating layer; a source or drain contact layer disposed on the interlayer dielectric layer, one end of the source or drain contact layer passing through the interlayer dielectric layer and the gate insulating layer to contact with a source or drain of the thin film transistor; and a passivation layer disposed on the interlayer dielectric layer and covering the source or drain contact layer; a light-emitting unit disposed on the active switch and including an anode electrode layer disposed on the passivation layer, one end of the anode electrode layer passing through the passivation layer to contact with the source or drain contact layer; a light-emitting region disposed on the anode electrode layer; a pixel defining layer disposed on the passivation layer and covering the anode electrode layer and the light-emitting region; and a gap control layer disposed on the pixel definition layer; and a second substrate disposed on the light-emitting unit.

In an embodiment of the invention, the second substrate of each of the sub-pixel units is formed by the same layer.

In an embodiment of the invention, the second substrate is a cathode transparent electrode layer disposed on the pixel defining layer and covering the gap control layer.

In an embodiment of the invention, the light-emitting region is a red light-emitting region, a green light-emitting region, or a blue light-emitting region.

In an embodiment of the invention, the thin film transistor includes the source, the drain, a channel region, and the gate; and the source, the drain, and the channel region of the thin film transistor are formed by the same layer; and the gate insulating layer covering the source, the drain, and the channel region of the thin film transistor; and the gate of the thin film transistor is disposed on the gate insulating layer and disposed at a position corresponding to the channel region of the thin film transistor.

In an embodiment of the invention, the image capturing region is driven by a first pixel driving circuit composed of four thin film transistors and one capacitor.

In an embodiment of the invention, the first pixel driving circuit includes: a first thin film transistor, a control end of the first thin film transistor electrically coupled to a first scan line, a first end of the first thin film transistor electrically coupled to a data line, and a second end of the first thin film transistor electrically coupled to a first node; a second thin film transistor, a control end of the second thin film transistor electrically coupled to the first node, and a second end of the second thin film transistor electrically coupled to a second node; a third thin film transistor, a control end of the third thin film transistor electrically coupled to a second scan line, a first end of the third thin film transistor electrically coupled to a reset voltage, and a second end of the third thin film transistor electrically coupled to the first node; a fourth thin film transistor, a control end terminal of the fourth thin film transistor electrically coupled to a light-emitting control signal, and a first end of the fourth thin film transistor electrically coupled to the second end of the second thin film transistor; a capacitor, a first end of the capacitor electrically coupled to the first node, and a second end of the capacitor electrically coupled to the second node; and a light-emitting diode, a first end of the light-emitting diode electrically coupled to a second end of the fourth thin film transistor, and a second end of the light-emitting diode electrically coupled to a second voltage; and the first node electrically coupled to a first voltage.

In an embodiment of the invention, the first thin film transistor, the second thin film transistor, the third thin film transistor, and the fourth thin film transistor are all P-type thin film transistors.

In an embodiment of the invention, the reset voltage and the second voltage are low voltages, and the first voltage is a high voltage.

In an embodiment of the invention, the display region is driven by a second pixel driving circuit composed of seven thin film transistors and one capacitor.

In an embodiment of the invention, the image capturing region is disposed at a right upper side and a lower right side of the display region. the image capturing regions are disposed at upper right, lower right of the display region.

In an embodiment of the invention, the image capturing region is disposed at upper right, lower right, middle of left, or middle of right of the display region.

In an embodiment of the invention, the shape of the image capturing region may be at least one of a rectangle, a circle, or an ellipse.

A further object of the present invention is an electronic device including the display panel according to any one of the embodiments of the present invention.

The electronic device is a mobile phone with two front cameras, the two front cameras are under a screen and respectively positioned at upper right and lower right of the screen; in a state that the mobile phone is in a portrait mode when a user needs to take a picture, only the front camera at the upper right of the screen turns on a camera function, and the front camera at the lower right of the screen is in a turn off state; and in a state that the mobile phone is in a landscape mode and runs an application that needs to activate an eye-tracking function, the two front cameras respectively at upper right and lower right of the screen simultaneously activate the eye-tracking function.

A further object of the present invention is a method of operating an electronic device. The electronic device is a mobile phone with four front cameras, the four front cameras are under a screen and respectively positioned at upper right, lower right, middle left, and middle right of the screen; in a state that the mobile phone is in a portrait mode when a user needs to take a picture, only the front camera at the upper right of the screen turns on a camera function, and the front camera at the lower right of the screen is in a turn off state; and in a state that the mobile phone is in a landscape mode and runs an application that needs to activate an eye-tracking function, the four front cameras respectively at the upper right, the lower right, the middle left, and the right of the screen simultaneously activate the eye-tracking function.

Beneficial Effect

By adding multiple cameras to a display panel and hiding them under the display panel, not only the accuracy of eyeball tracking technology is improved, but also the problem of reduced aesthetics of appearance caused by the multiple cameras is prevented.

DESCRIPTION OF DRAWINGS

In order to more clearly illustrate the technical solutions in the embodiments of the present invention, the following figures described in the embodiments will be briefly introduced. It is obvious that the drawings described below are merely some embodiments of the present invention, other drawings can also be obtained by a person of ordinary skill in the field based on these drawings without doing any creative activity.

DETAILED DESCRIPTION OF PREFERRED EMBODIMENTS

Figure 1:
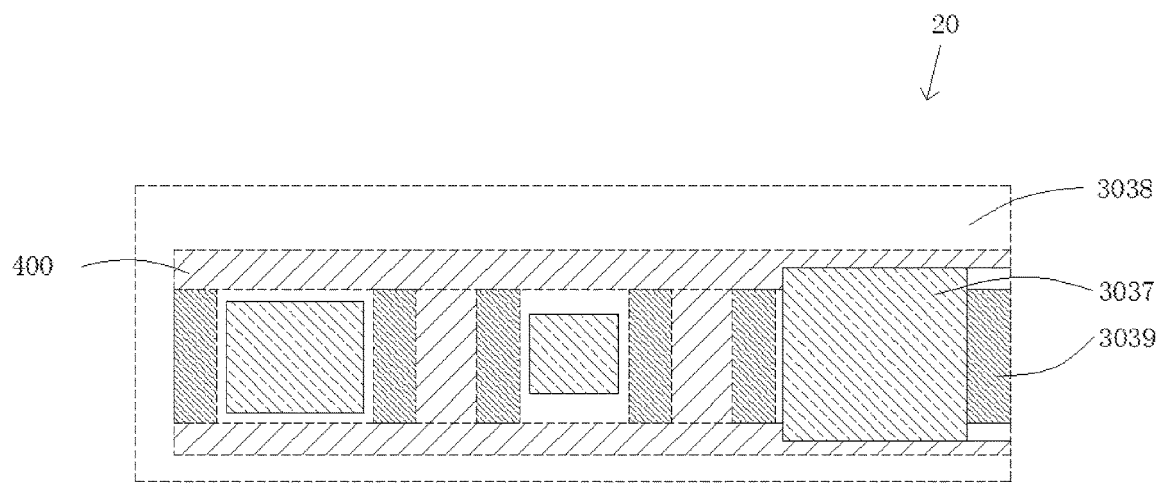
FIG. 1 is a schematic cross-sectional structural view of an image capturing region of a display panel according to an embodiment of the present invention.

The following description of the various embodiments is provided to illustrate the specific embodiments of the invention. The directional terminology mentioned in the invention, such as "upper", "lower", "front", "behind", "left", "right", "inside", "outside", "side", etc., merely refers to the direction of the drawing. Therefore, the directional terminology is used to describe and understand the invention, and not to limit the invention.

The drawings and the description are to be regarded as illustrative rather than restrictive. In the drawings, structurally similar components are denoted by the same reference numerals. In addition, the size and thickness of each component shown in the drawings are arbitrarily shown for the sake of understanding and convenience of description, but the present invention is not limited thereto.

In the drawings, the thickness of layers, films, panels, regions, etc. are exaggerated for clarity. In the drawings, the thickness of layers and regions are exaggerated for the purposes of illustration and description. It will be understood that when a component such as a layer, a film, a region or a substrate is referred to as being "on" another component, the component can be directly on the other component or an intermediate component can also be present.

In addition, in the specification, the word "comprising" is to be understood to include the component, but does not exclude any other component. Further, in the specification, "on" means positioned above or below the target component, and does not mean that it must be on the top based on the direction of gravity.

In order to further explain the technical means and functions for achieving the object of the invention, the display panel and the electronic device and the operation method of the electronic device according to the present invention will be described below with reference to the accompanying drawings and preferred embodiments. The specific implementation, structure, characteristics, and effect thereof are described in detail below.

As shown in FIG. 1, an embodiment of the present invention provides a display panel 100 divided into a display region 10 and a plurality of image capturing regions 20.

Each of the image capturing regions 20 includes: a camera module 400, a pixel module 300 disposed on the camera module 400 and including a plurality of sub-pixel units 301, and each of the sub-pixel units 301 is spaced apart on the camera module 400.

Figure 2:
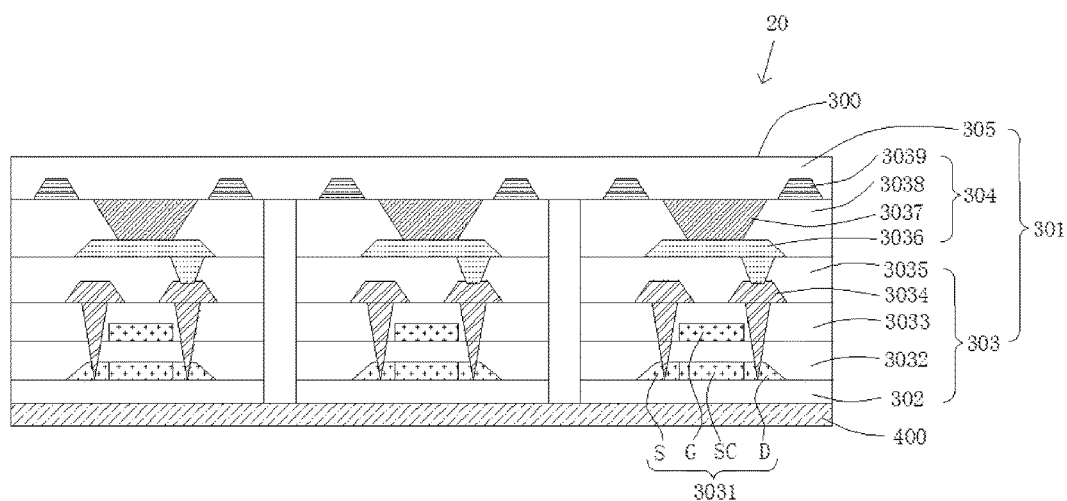
FIG. 2 is a schematic cross-sectional structural view of an image capturing region of a display panel according to an embodiment of the present invention.
Figure 3:
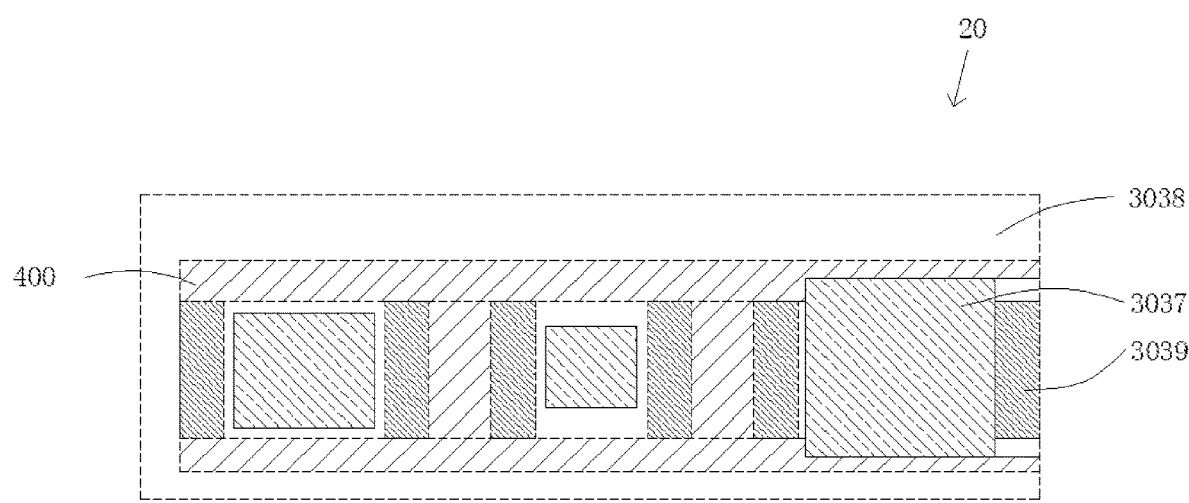
FIG. 3 is a top plan view showing a structure of an image capturing region of a display panel according to an embodiment of the present invention.

Please refer to FIG. 2 and FIG. 3. FIG. 2 is a schematic cross-sectional structural view of an image capturing region 20 of the display panel 100 according to an embodiment of the present invention. FIG. 3 is a top plan view showing a structure of the image capturing region 20 of the display panel 100 according to an embodiment of the present invention.

As shown in FIG. 2 and FIG. 3, an embodiment of the present invention provides a display panel 100, which is divided into a display region 10 and a plurality of image capturing regions 20, each of the image capturing regions 20 includes a camera module 400, and a pixel module 300 disposed on the camera module 400. The pixel module 300 includes a plurality of sub-pixel units 301, and each of the sub-pixel units 301 is spaced apart on the camera module 400. Each of the sub-pixel units 301 includes: a first substrate 302 disposed on the camera module 400; a thin film transistor 3031 disposed on the first substrate 302, a gate insulating layer 3032 disposed between the first substrate 302 and a gate G of the thin film transistor 3031, an interlayer dielectric layer 3033 disposed on the gate insulating layer 3032, a source or drain contact layer 3034 disposed on the interlayer dielectric layer 3033, one end of the source or drain contact layer 3034 passing through the interlayer dielectric layer 3033 and the gate insulating layer 3032 to contact with a source S or drain D of the thin film transistor 3031, and a passivation layer 3035 disposed on the interlayer dielectric layer 3033 and covering the source or drain contact layer 3034; an anode electrode layer 3036 disposed on the passivation layer 3035, one end of the anode electrode layer 3036 passing through the passivation layer 3035 to contact with the source or drain contact layer 3034, a light-emitting region 3037 disposed on the anode electrode layer 3036, a pixel defining layer 3038 disposed on the passivation layer 3035 and covering the anode electrode layer 3036 and the light-emitting region 3037, a gap control layer 3039 disposed on the pixel defining layer 3038; and a second substrate 305 disposed on the pixel defining layer 3038 and covering the gap control layer 3039. The second substrate 305 of each of the sub-pixel units 301 is formed of the same layer body.

In an embodiment of the present invention, each of the sub-pixel units 301 includes: a first substrate 302 disposed on the camera module 400, an active switch 303 disposed on the first substrate 302, a light-emitting unit 304 disposed on the active switch 303, and a second substrate 305 disposed on the light-emitting unit 304.

In an embodiment of the present invention, the second substrate 305 of each of the sub-pixel units 301 is formed of the same layer body.

In an embodiment of the present invention, the second substrate 305 is a cathode transparent electrode layer.

In an embodiment of the present invention, the light-emitting region 3037 is a red light-emitting region, a green light-emitting region, or a blue light-emitting region.

In an embodiment of the present invention, the thin film transistor 3031 includes a source S, a drain D, a channel region SC, and a gate G. The source S, the drain D, and the channel region SC of the thin film transistor 3031 are formed by the same layer. The gate insulating layer 3032 covers the source S, the drain D, and the channel region SC of the thin film transistor 3031. The gate G of the thin film transistor 3031 is disposed on the gate insulating layer 3032 and disposed at a position corresponding to the channel region SC of the thin film transistor 3031.

In an embodiment of the present invention, the image capturing region 20 is driven by a first-pixel driving circuit consisting of four thin film transistors and one capacitor.

Figure 4:
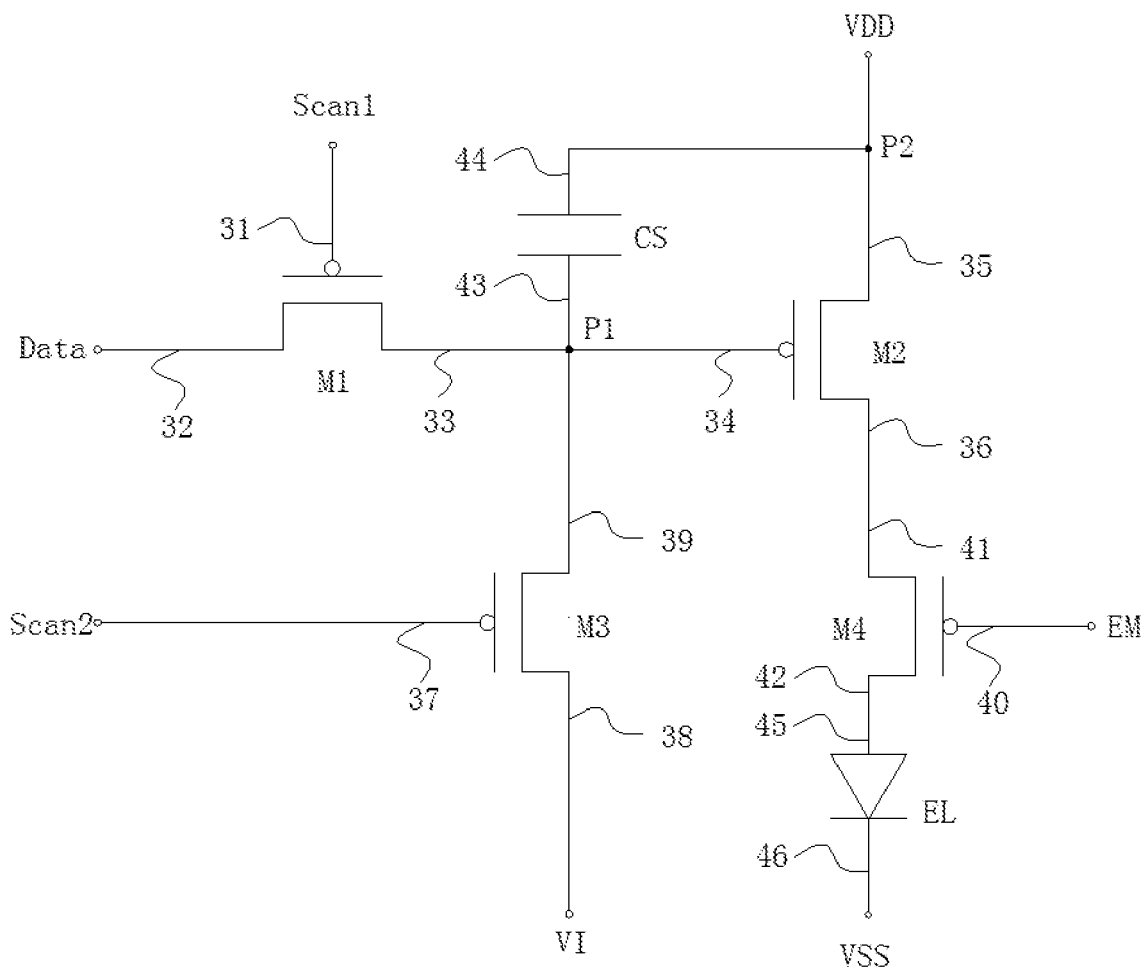
FIG. 4 is a first pixel driving circuit diagram of an image capturing region of a display panel according to an embodiment of the present invention.

Please refer to FIG. 4. FIG. 4 is a first pixel driving circuit diagram of an image capturing region 20 of a display panel 100 according to an embodiment of the present invention.

As shown in FIG. 4, in an embodiment of the present invention, the first pixel driving circuit includes:
a first thin film transistor M1, a control end 31 of the first thin film transistor M1 electrically coupled to a first scan line Scan1, a first end 32 of the first thin film transistor M1 electrically coupled to a data line Data, and a second end 33 of the first thin film transistor M1 electrically coupled to a first node P1; a second thin film transistor M2, a control end 34 of the second thin film transistor M2 electrically coupled to the first node P1, and a second end 35 of the second thin film transistor M2 electrically coupled to a second node P2; a third thin film transistor M3, a control end 37 of the third thin film transistor M3 electrically coupled to a second scan line Scan 2, a first end 38 of the third thin film transistor M3 electrically coupled to a reset voltage VI, and a second end 39 of the third thin film transistor M3 electrically coupled to the first node P1; a fourth thin film transistor M4, a control end 40 of the fourth thin film transistor M4 electrically coupled to a light-emitting control signal EM, and a first end 41 of the fourth thin film transistor M4 electrically coupled to the second end 36 of the second thin film transistor M2; a capacitor CS, a first end 43 of the capacitor CS electrically coupled to the first node P1, and a second end 44 of the capacitor CS electrically coupled to the second node P2; and a light-emitting diode EL, a first end 45 of the light-emitting diode EL electrically coupled to a second end 42 of the fourth thin film transistor M4, and a second end 46 of the light-emitting diode EL electrically coupled to a second voltage VSS; and the first node P1 electrically coupled to a first voltage VDD.

The display panel 100 designed by the first pixel driving circuit can effectively reduce the number of thin film transistors under the camera and maintain the resolution of the camera region, while ensuring basic charging, discharging, resetting, and illuminating control functions.

In an embodiment of the present invention, the first thin film transistor M1, the second thin film transistor M2, the third thin film transistor M3, and the fourth thin film transistor M4 are all P-type thin film transistors.

In an embodiment of the invention, the reset voltage VI and the second voltage VSS are low voltages, and the first voltage VDD is a high voltage.

In an embodiment of the present invention, the display region 10 is driven by a second pixel driving circuit consisting of seven thin film transistors and one capacitor.

Figure 5:
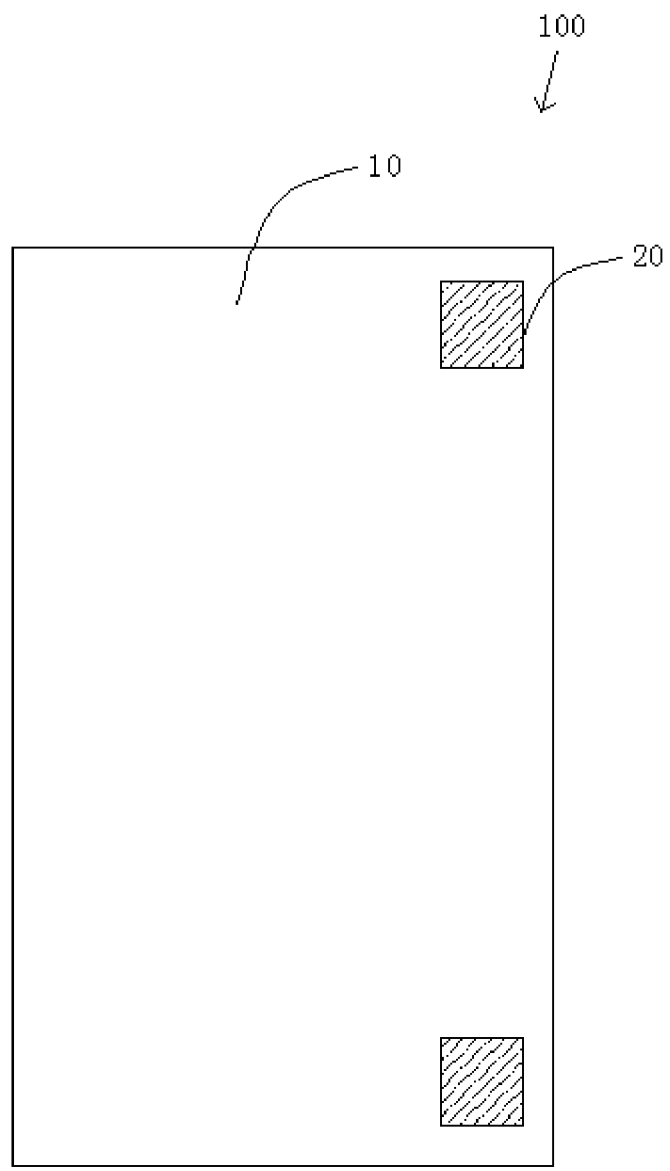
FIG. 5 is a schematic diagram showing a distribution of an image capturing region of a display panel according to an embodiment of the present invention.

Please refer to FIG. 5. FIG. 5 is a schematic diagram showing the distribution of the image capturing region 20 of the display panel 100 according to an embodiment of the present invention. As shown in FIG. 5, in an embodiment of the present invention, the image capturing region 20 is disposed at upper right and lower right of the display region 10.

Figure 6:
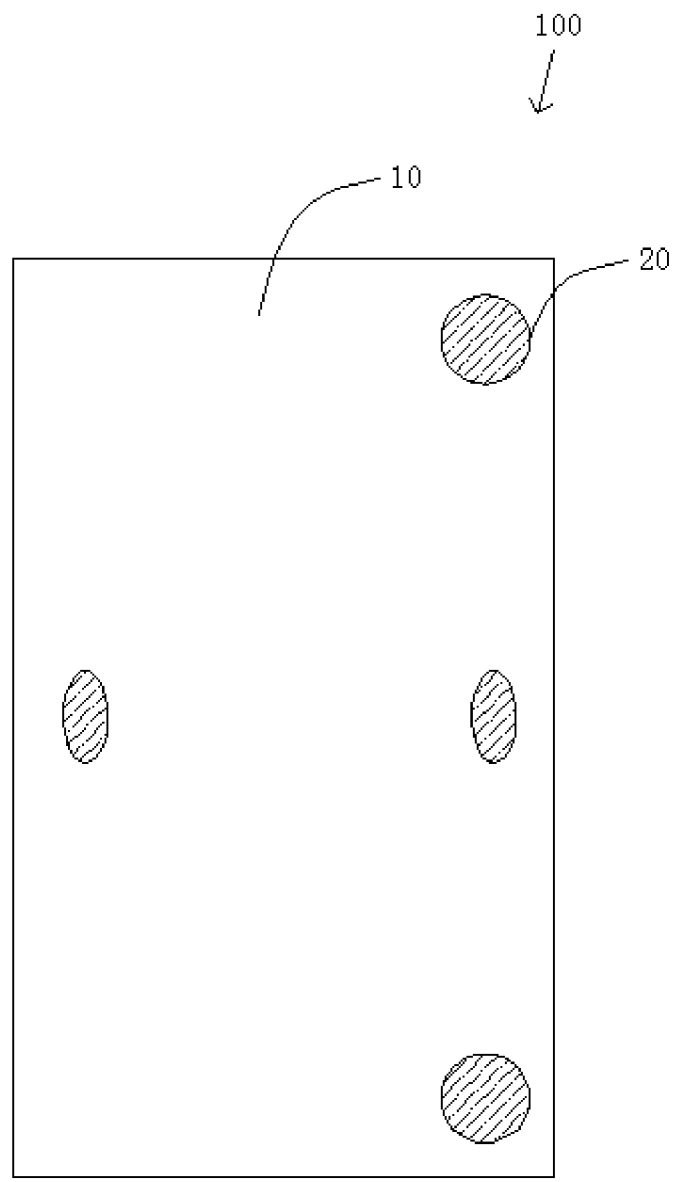
FIG. 6 is a schematic diagram showing a distribution of an image capturing region of a display panel according to an embodiment of the present invention.

Please refer to FIG. 6. FIG. 6 is a schematic diagram showing the distribution of the image capturing region 20 of the display panel 100 according to an embodiment of the present invention. As shown in FIG. 6, in an embodiment of the present invention, the image capturing region 20 is disposed at upper right, lower right, middle left, and middle right of the display region 10.

In an embodiment of the present invention, there are at least two image capturing regions 20. In an embodiment of the present invention, the image capturing region 20 has a shape of at least one of a rectangle, a circle, or an ellipse.

In an embodiment of the present invention, an electronic device includes the display panel 100 according to any one of the embodiments of the present invention.

In an embodiment of the present invention, the electronic device may be a device having a display screen and camera, such as a mobile phone, a tablet, a notebook, etc.

Specifically, the electronic device is a mobile phone with two front cameras, and the two cameras are hidden under the screen and are respectively positioned at the upper right and lower right of the screen of the mobile phone. When the mobile phone is in a portrait mode, when a user needs to take a picture, only the front camera at the upper right of the screen turns on a camera function, and the front camera at the lower right of the screen is in a turned off state; and when the mobile phone is in a landscape mode and runs an application that needs to activate an eye-tracking function, the two front cameras respectively at upper right and lower right of the screen simultaneously activate the eye-tracking function.

Specifically, the electronic device is a mobile phone with four front cameras, and the four front cameras are hidden under the screen and respectively positioned at upper right, lower right, middle left, and middle right of the screen. When the mobile phone is in a portrait mode, when a user needs to take a picture, only the front camera at the upper right of the screen turns on a camera function, and the front camera at the lower right of the screen is in a turned off state; and when the mobile phone is in a landscape mode and runs an application that needs to activate an eye-tracking function, the four front cameras respectively at the upper right, the lower right, the middle left, and the right of the screen simultaneously activate the eye-tracking function.

The invention has the beneficial effect of: by adding a plurality of cameras on the display panel and hiding them under the display panel, the accuracy of the eyeball tracking technology can be improved, and the problem of reduced aesthetics of the appearance caused by the multiple cameras can be prevented.

The above description is only a preferred embodiment of the present invention and is not intended to limit the present invention. Although the present invention has been disclosed above in the preferred embodiments, it is not intended to limit the invention. Any person skilled in the art can make some modifications to equivalent embodiments when using the above-disclosed technical contents without departing from the technical scope of the present invention. Any simple modifications or equivalent changes to the above embodiments in accordance with the spirit of the present invention are still within the scope of the technical solutions of the present invention.

INDUSTRIAL APPLICABILITY

The subject matter of the present application can be manufactured and used in the industry with industrial applicability.

What is claimed is:

1. A display panel, divided into a display region and a plurality of image capturing regions, wherein each of the plurality of image capturing regions comprises:
    a camera module; and
    a pixel module disposed on the camera module, wherein the pixel module comprises a plurality of sub-pixel units, and the plurality of sub-pixel units are spaced apart on the camera module;
    wherein each of the plurality of sub-pixel units comprises:
        a first substrate disposed on the camera module;
        an active switch disposed on the first substrate and comprising a thin film transistor disposed on the first substrate, a gate insulating layer disposed between the first substrate and a gate of the thin film transistor, an interlayer dielectric layer disposed on the gate insulating layer, a source or drain contact layer disposed on the interlayer dielectric layer, and a passivation layer disposed on the interlayer dielectric layer and covering the source or drain contact layer, wherein one end of the source or drain contact layer penetrates the interlayer dielectric layer and the gate insulating layer to contact with a source or drain of the thin film transistor;
        a light-emitting unit disposed on the active switch and comprising an anode electrode layer disposed on the passivation layer, a light-emitting region defined on the anode electrode layer, a pixel defining layer disposed on the passivation layer and covering the anode electrode layer and the light-emitting region, and a gap control layer disposed on the pixel defining layer, wherein one end of the anode electrode layer penetrates the passivation layer to contact with the source or drain contact layer; and
        a second substrate disposed on the light-emitting unit; and
    wherein there are at least two image capturing regions, and the at least two image capturing regions are disposed at an upper right, a lower right, a middle left, or a middle right of the display region.

2. The display panel according to claim 1, wherein the second substrate of each of the plurality of sub-pixel units is formed by same layer.

3. The display panel according to claim 1, wherein the second substrate is a cathode transparent electrode layer disposed on the pixel defining layer and covering the gap control layer.

4. The display panel according to claim 1, wherein the thin film transistor comprises the source, the drain, a channel region, and the gate, and wherein the source, the drain, and the channel region of the thin film transistor are formed by same layer; wherein the gate insulating layer covers the source, the drain, and the channel region of the thin film transistor;
    and wherein the gate of the thin film transistor is disposed on the gate insulating layer and disposed at a position corresponding to the channel region of the thin film transistor.

5. The display panel according to claim 1, wherein the image capturing regions are driven by a first pixel driving circuit consisting of four thin film transistors and one capacitor.

6. The display panel according to claim 5, wherein the first pixel driving circuit comprises:
    a first thin film transistor, wherein a control end of the first thin film transistor is electrically coupled to a first scan line, a first end of the first thin film transistor is electrically coupled to a data line, and a second end of the first thin film transistor is electrically coupled to a first node;
    a second thin film transistor, wherein a control end of the second thin film transistor is electrically coupled to the first node, and a second end of the second thin film transistor is electrically coupled to a second node;
a third thin film transistor, wherein a control end of the third thin film transistor is electrically coupled to a second scan line, a first end of the third thin film transistor is electrically coupled to a reset voltage, and a second end of the third thin film transistor is electrically coupled to the first node;
a fourth thin film transistor, wherein a control end of the fourth thin film transistor is electrically coupled to a light-emitting control signal, and a first end of the fourth thin film transistor is electrically coupled to the second end of the second thin film transistor;
a capacitor, wherein a first end of the capacitor is electrically coupled to the first node, and a second end of the capacitor is electrically coupled to the second node;
a light-emitting diode, wherein a first end of the light-emitting diode is electrically coupled to a second end of the fourth thin film transistor, and a second end of the light-emitting diode is electrically coupled to a second voltage; and
the first node electrically coupled to a first voltage.

7. The display panel according to claim 1, wherein the image capturing regions have a shape of at least one of a rectangle, a circle, or an ellipse.

8. An electronic device, comprising the display panel of claim 1.

9. A method of operating an electronic device, wherein when the electronic device is a mobile phone with two front cameras, the two front cameras are hidden under a screen and respectively positioned at an upper right and a lower right of the screen;
when the mobile phone is in a portrait mode and a user needs to take a picture, only the front camera at the upper right of the screen turns on a camera function, and the front camera at the lower right of the screen is in a turned off state; and
when the mobile phone is in a landscape mode and runs an application that needs to activate an eye-tracking function, the two front cameras respectively at the upper right and the lower right of the screen simultaneously activate the eye-tracking function;
alternatively, when the electronic device is a mobile phone with four front cameras, the four front cameras are hidden under the screen and respectively positioned at the upper right, the lower right, a middle left, and a middle right of the screen;
when the mobile phone is in the portrait mode and a user needs to take a picture, only the front camera at the upper right of the screen turns on the camera function, and the front camera at the lower right of the screen is in the turned off state; and
when the mobile phone is in the landscape mode and runs an application that needs to activate the eye-tracking function, the four front cameras respectively at the upper right, the lower right, the middle left, and the middle right of the screen simultaneously activate the eye-tracking function.

* * * * *